(12) United States Patent
Schwaiger

(10) Patent No.: US 9,161,462 B2
(45) Date of Patent: Oct. 13, 2015

(54) HYGIENE-COMPLIANT DISPLAY AND CONTROL DEVICE

(71) Applicant: BERNECKER + RAINER INDUSTRIE-ELEKTRONIK Ges.m.b.H., Eggelsberg (AT)

(72) Inventor: Rudolf Schwaiger, Laufen (DE)

(73) Assignee: BERNECKER + RAINER INDUSTRIE-ELEKTRONIK Ges.m.b.H., Eggelsberg (AT)

( * ) Notice: Subject to any disclaimer, the term of this patent is extended or adjusted under 35 U.S.C. 154(b) by 0 days.

(21) Appl. No.: 13/669,948

(22) Filed: Nov. 6, 2012

(65) Prior Publication Data
US 2013/0113167 A1 May 9, 2013

(30) Foreign Application Priority Data
Nov. 7, 2011 (AT) .................. A 1639/2011

(51) Int. Cl.
*H05K 5/00* (2006.01)
*H05K 5/06* (2006.01)

(52) U.S. Cl.
CPC .............. *H05K 5/0017* (2013.01); *H05K 5/061* (2013.01)

(58) Field of Classification Search
USPC ........... 277/641, 642, 644, 648, 598; 411/393
See application file for complete search history.

(56) References Cited

U.S. PATENT DOCUMENTS

| | | | | |
|---|---|---|---|---|
| 1,989,955 A | * | 2/1935 | Van Patter | 403/281 |
| 2,032,492 A | * | 3/1936 | Nathan | 277/615 |
| 2,451,070 A | * | 10/1948 | Chamberlain | 277/617 |
| 2,995,057 A | * | 8/1961 | Nenzell | 411/399 |
| 3,202,463 A | * | 8/1965 | Fatt | 384/433 |
| 3,353,832 A | * | 11/1967 | Coulson | 277/591 |
| 3,570,704 A | * | 3/1971 | Roson | 220/203.02 |
| 3,575,431 A | * | 4/1971 | Bryant | 277/641 |
| 3,677,588 A | * | 7/1972 | Coffield, Jr. | 248/500 |
| 3,727,926 A | * | 4/1973 | Berry | 277/644 |
| 3,858,752 A | * | 1/1975 | Marvin et al. | 220/325 |
| 3,909,019 A | * | 9/1975 | Leko | 277/649 |
| 4,026,565 A | * | 5/1977 | Jelinek | 277/639 |
| 4,113,268 A | * | 9/1978 | Simmons et al. | 277/641 |
| 4,158,757 A | * | 6/1979 | Reichert et al. | 200/302.1 |
| 4,192,520 A | * | 3/1980 | Hasegawa | 277/591 |
| 4,202,311 A | * | 5/1980 | Moriyoshi | 123/195 C |
| 4,410,186 A | * | 10/1983 | Pierce, Jr. | 277/318 |

(Continued)

FOREIGN PATENT DOCUMENTS

DE 21 37 810 3/1972

*Primary Examiner* — Vishal Patel
*Assistant Examiner* — L. Susmitha Koneru
(74) *Attorney, Agent, or Firm* — Greenblum & Bernstein, P.L.C.

(57) ABSTRACT

Machines and systems for chemical, foodstuffs and pharmaceuticals industry are subject to particularly demanding requirements for hygiene. In particular, equipment used in such machines, must avoid any gaps, in which dirt, bacteria or germs could settle. To avoid this, a hygiene-compliant display and control device having a front plate is proposed, having a peripheral groove, which is open on the outer peripheral surface of the front plate, on the outer edge of the front plate, and a sealing element fitted in the peripheral groove. The outer peripheral surface of the sealing element is arranged flush with the outer peripheral surface of the front plate, and a number of clamping arrangements with a pressing element are provided on the display and control device distributed around the periphery. One axial end of the pressing element engages with a fixing frame, which rests on the mounting plate, or with the mounting plate.

15 Claims, 2 Drawing Sheets

(56) References Cited

U.S. PATENT DOCUMENTS

| | | | |
|---|---|---|---|
| 4,501,432 A * | 2/1985 | Kuniyoshi et al. | 277/591 |
| 4,699,293 A * | 10/1987 | Duchrow | 220/378 |
| 5,035,185 A * | 7/1991 | Schultz | 105/424 |
| 5,391,416 A * | 2/1995 | Kunert | 428/122 |
| 5,785,322 A * | 7/1998 | Suggs et al. | 277/615 |
| 6,073,938 A * | 6/2000 | Abe et al. | 277/654 |
| 6,142,483 A * | 11/2000 | Bryant, III | 277/598 |
| 6,173,969 B1 * | 1/2001 | Stoll et al. | 277/630 |
| 6,179,299 B1 * | 1/2001 | Schweiger | 277/598 |
| 6,264,206 B1 * | 7/2001 | Hashizawa et al. | 277/641 |
| 6,305,695 B1 * | 10/2001 | Wilson | 277/584 |
| 6,361,049 B1 * | 3/2002 | Joco | 277/312 |
| 6,523,833 B1 * | 2/2003 | Ishigaki et al. | 277/650 |
| 6,533,287 B1 * | 3/2003 | Belter | 277/598 |
| 6,827,353 B2 * | 12/2004 | Fonville et al. | 277/598 |
| 6,837,498 B2 * | 1/2005 | Fluck et al. | 277/630 |
| 6,854,739 B2 * | 2/2005 | Schleth et al. | 277/642 |
| 6,957,814 B2 * | 10/2005 | Murakami et al. | 277/592 |
| 7,311,311 B2 * | 12/2007 | Hosokawa | 277/641 |
| 7,338,050 B1 * | 3/2008 | Tellez | 277/616 |
| 7,413,164 B2 * | 8/2008 | Yamagishi | 251/333 |
| 7,434,617 B2 * | 10/2008 | Artherholt | 166/202 |
| 7,775,559 B2 * | 8/2010 | Steinbock et al. | 285/90 |
| 7,823,888 B2 * | 11/2010 | Hayashi | 277/644 |
| 7,857,322 B2 * | 12/2010 | Fietz | 277/566 |
| 7,967,298 B2 * | 6/2011 | Hurlbert et al. | 277/567 |
| 8,029,740 B2 * | 10/2011 | Hyde et al. | 422/292 |
| 8,113,519 B2 * | 2/2012 | Yoshida | 277/637 |
| 8,123,230 B2 * | 2/2012 | Yoshijima et al. | 277/593 |
| 8,181,972 B2 * | 5/2012 | Tsuji | 277/644 |
| 8,246,055 B2 * | 8/2012 | Asplund et al. | 277/609 |
| 2004/0036233 A1 * | 2/2004 | Schleth et al. | 277/641 |
| 2006/0006612 A1 * | 1/2006 | Durfield et al. | 277/644 |
| 2006/0038358 A1 * | 2/2006 | James | 277/641 |
| 2009/0085306 A1 * | 4/2009 | Hayashi | 277/644 |
| 2009/0232690 A1 * | 9/2009 | Maruo et al. | 418/191 |
| 2009/0256317 A1 * | 10/2009 | Mellander | 277/642 |
| 2011/0169229 A1 * | 7/2011 | Hamade et al. | 277/650 |
| 2011/0227295 A1 * | 9/2011 | Watanabe et al. | 277/591 |
| 2012/0313330 A1 * | 12/2012 | Scalf et al. | 277/631 |

* cited by examiner

HYGIENE-COMPLIANT DISPLAY AND CONTROL DEVICE

CROSS-REFERENCE TO RELATED APPLICATIONS

The present application claims priority under 35 U.S.C. §119(a) of Austrian Patent Application No. A 1639/2011 filed Nov. 7, 2011, the disclosure of which is expressly incorporated by reference herein in its entirety.

BACKGROUND OF THE INVENTION

1. Field of the Invention

The present invention relates to a hygiene-compliant display and control device having a front plate as well as a mounting plate and a sealing element which is arranged between front plate and mounting plate.

2. Discussion of Background Information

Machines and systems for the chemical, foodstuffs and pharmaceuticals industry are subject to particularly demanding requirements for hygiene, especially in the case of "open" processes in which the products can come into direct or indirect contact with the manufacturing equipment. Criteria here include resistance to corrosion and a defined surface quality as well as low susceptibility to contamination and cleaning friendliness. This also means a high level of robustness, as along with water jets and cleaning agents, high-pressure cleaners are often used in the necessary frequent cleaning operations. In addition, standards for the nature of the equipment have been developed in order to satisfy these requirements, e.g. protection class IP69K according to EN 60529. Here the number 6 means protection of the electrical equipment against the ingress of solid bodies including dust by complete sealing, and 9K means protection against the ingress of water during high-pressure or steam-jet cleaning.

While appropriately designed electrical cabinets protect many automation components, display and control devices, which are often arranged directly in the workplace, are affected directly by the requirements of this norm and must likewise have the defined protection class, e.g. IP69K. In addition, the materials used must be able to cope with the cleaning chemicals and the temperature, the seals must prevent the ingress of liquids, even under pressure, and the electronics must also be able to withstand the changes in temperature which occur.

Conventional seals are unable to fulfill these requirements and are therefore unsuitable, as a gap in which bacteria and germs and other contamination can settle and accumulate always remains between the components to be sealed, which is inadmissible for the demanding hygiene-compliant requirements.

A seal arrangement, which seals radially inwards between two hollow components, is in turn disclosed in DE 21 37 810 A. Here, an open peripheral gap, in which a sealing element is fitted flush with the inner peripheral surface, is provided radially inwards on a component. However, from this publication, it cannot be seen how the two components are pressed together in order to effect an adequate sealing of the sealing elements.

SUMMARY OF THE EMBODIMENTS

The present invention therefore sets itself the task of improving a display and control device so that it fulfills the demanding hygiene-compliant requirements for sealing, susceptibility to contamination and cleaning friendliness.

According to the invention, this object is achieved in that a peripheral groove, which is open on the outer peripheral surface of the front plate, is provided on the outer edge of the front plate of the display and control device, and a sealing element is fitted in the peripheral groove, wherein the outer peripheral surface of the sealing element is arranged flush with the outer peripheral surface of the front plate and, furthermore, a number of clamping arrangements with a pressing element are provided on the display and control device distributed around the periphery, wherein one axial end of the pressing element engages with a fixing frame, which rests on the mounting plate, or with the mounting plate. This ensures that a flush peripheral surface is produced at the outer peripheral edge of the front plate, as a result of which a gap cannot form at this point. The display and control device can easily be pressed against the mounting plate by means of the pressing element and, at the same time, the sealing element is compressed, by means of which a hygiene-compliant seal is produced.

Preferably, the sealing element is designed with a first sealing body which is arranged at the outer peripheral edge and which forms the outer peripheral surface of the sealing element. This enables a defined sealing point (width, form, height, etc.), which can be optimally adapted to suit the particular requirements, to be created with the first sealing body without necessarily having to change the rest of the sealing element.

If a further sealing body is provided inside the first sealing body, the reliability of the seal is increased, particularly in order to ensure that no cleaning medium can penetrate in the event that the outer sealing barrier were to be overcome during high-pressure cleaning.

It is likewise advantageous when the first sealing body and/or a further sealing body has a greater height than the depth of the peripheral groove, as this also enables the effect of the seal to be specifically adapted. In particular, this enables the contact pressure and therefore the sealing effect to be specifically adjusted.

In order to simplify assembly, a number of depressions, in which projections arranged on the sealing element engage, can be arranged in the base of the peripheral groove. This enables the sealing element to be easily fixed in position on the display and control device.

Other exemplary embodiments and advantages of the present invention may be ascertained by reviewing the present disclosure and the accompanying drawing.

BRIEF DESCRIPTION OF THE DRAWINGS

The present invention is described below with reference to FIGS. 1 to 3, which show advantageous embodiments of the invention in an exemplary, schematic and non-restricting form.

DETAILED DESCRIPTION OF THE EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
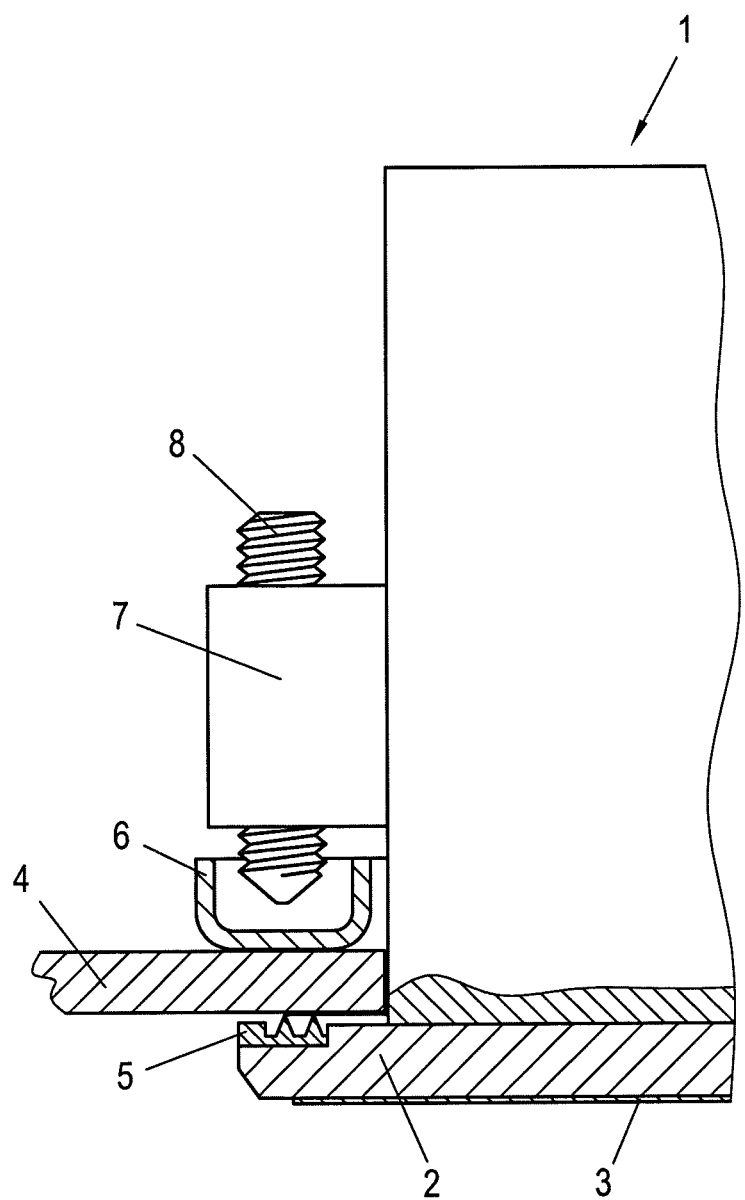

FIG. 1 shows a display and control device 1 having a front plate 2, e.g. made of stainless steel, which is visible from the outside. The front plate 2 can have indicator units, which are not shown in more detail here, such as displays, lamps, touch panels etc., and control units such as knobs, buttons, touch panel etc. The indicator and control units can be covered on the outside by a suitable film 3 for protection and for hygiene reasons, as shown in FIG. 1. The display and control device 1 can be arranged on a mounting plate 4. The mounting plate 4 can be part of a machine housing or electrical panel housing, for example, or any other machine or system part.

In the exemplary embodiment shown, the display and control device 1 can be retained on the mounting plate 4 by a fixing frame 6. In doing so, the fixing frame 6 is advantageously arranged around the periphery of the display and control device 1. A number of clamping units 7, into which a clamping screw 8 is screwed in each case, are arranged distributed around the periphery of the display and control device 1. The clamping screws 8 engage with the fixing frame 6 with an axial end. The fixing frame 6 can now be pressed against the mounting plate 4 by means of the clamping screws 8, whereby the display and control device 1 is likewise pressed against the mounting plate 4. As a result, the sealing element 5 is compressed, thus producing a hygiene-compliant seal as described in detail below. The fixing frame 6 could of course be omitted, particularly if the mounting plate 4 were sufficiently thick, whereby, in this case, the clamping screws would engage directly with the mounting plate 4.

Any other clamping arrangements, such as clamping levers or spring-actuated clamps which are known per se, are also conceivable for retaining the display and control device 1. In this case, an alternative clamping element, which engages with the mounting plate 4 or with a fixing frame 6, is used as the clamping element instead of a clamping screw 8.

Figure 2:
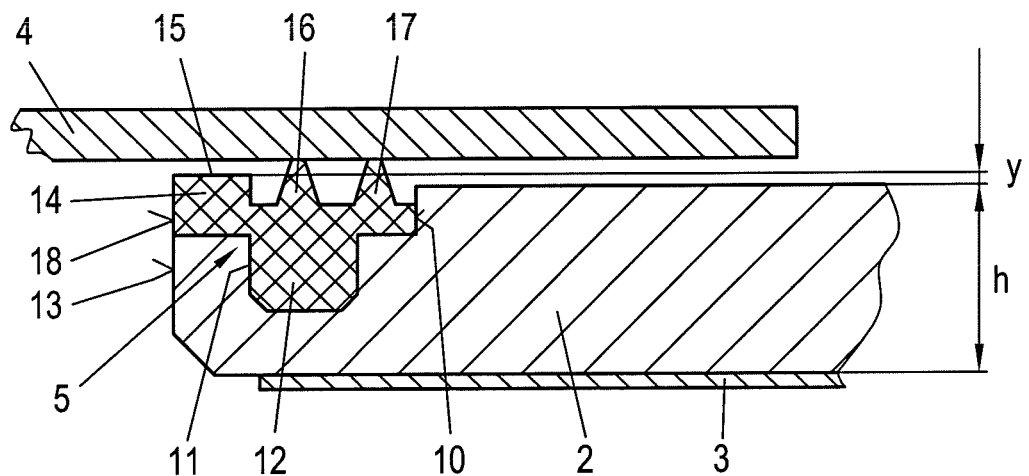
Figure 3:
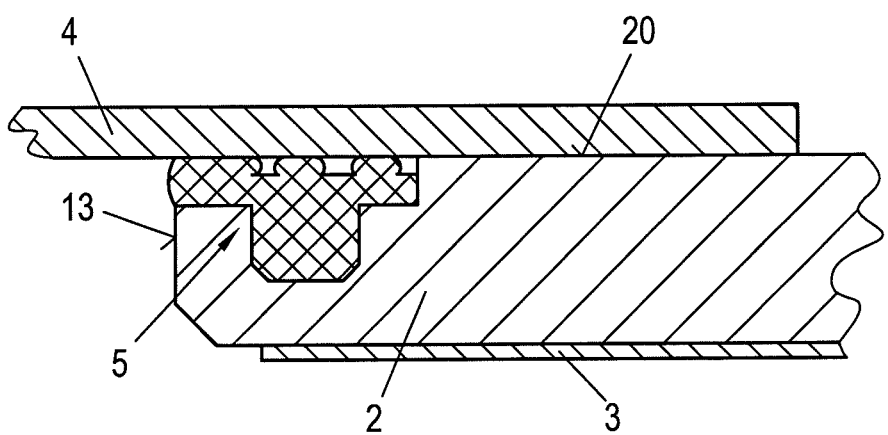

In order to eliminate a gap between front plate 2 and mounting plate 4, a sealing element 5 according to the invention, which is described in more detail with reference to FIGS. 2 and 3, is provided between these parts.

A circumferential peripheral groove 10, which is open on the outer peripheral surface 13 of the front plate 2 and in which the sealing element 5 is fitted, is provided on the outer periphery of the front plate 2. In doing so, the sealing element 5 is arranged on the outer peripheral edge flush with the outer peripheral surface 13 of the front plate 2, thus resulting in a continuous peripheral surface without gap in the compressed state (FIG. 3).

For this purpose, the sealing element 5 is designed as a seamless frame which is arranged in the peripheral groove 10, wherein the outer peripheral surface 18 of the sealing element 5 is arranged flush with the peripheral surface 13 of the front plate 2. A first sealing body 14 is provided at the outer peripheral edge of the sealing element 5 and finishes flush with the peripheral surface 13 of the mounting plate 4 at the outer peripheral edge. Here, the first sealing body 14 is designed with a rectangular shape and has a flat sealing surface 15 which faces the mounting plate 4 and is arranged parallel to the surface extension of the mounting plate 4 and the front plate 2.

When the sealing element 5 is fitted in the peripheral groove 10, in the non-assembled state (FIG. 2), the first sealing body 14 is preferably a dimension y higher than the height h of the front plate 2—or, expressed in another way, the height of the first sealing body 14 is a dimension y higher than the depth of the peripheral groove 10. This ensures that the first sealing body 14 is compressed on assembly.

Optionally, further sealing bodies which are arranged further towards the inside, e.g. second and third triangular sealing bodies 16, 17 as in the exemplary embodiment shown, can be arranged inside the first outer sealing body 14. These can also have a greater height than the depth of the peripheral groove 10 in order to ensure that the sealing bodies 16, 17 are compressed on assembly. These further sealing bodies 16, 17 serve primarily as additional safety, particularly in order to ensure that no cleaning medium can penetrate during high-pressure cleaning.

It can also be provided that a number of depressions 11, e.g. blind holes, in which projections 12, e.g. protruding knobs, which are arranged on the sealing element, engage in order to fix the sealing element 5 in position, are arranged distributed around the periphery in the base of the peripheral groove 10, which can simplify assembly.

The sealing element 5 is a seamless frame, e.g. made of silicone or some other suitable plastic, which is preferably injection molded in one piece to the exact size. Endless profiles fitted in the peripheral groove 10 are not suitable for the present application in the hygiene sector, as there is always a gap at the join on the face side.

On assembly (FIG. 3), the mounting plate 4 and the front plate 2 are pressed together until the two plates lie flat against one another at a contact surface 20. In doing so, the height of the sealing element 5 or the sealing bodies 14, 16, 17, is compressed in order to achieve an adequate sealing effect. This results in a seamless and gapless transition between front plate 2 and mounting plate 4 at the outer peripheral surface 13 in order to satisfy the demanding requirements in the hygiene sector. At the same time, the sealing bodies 14, 16, 17 will bulge (as shown in an exaggerated manner in FIG. 3), wherein the outer peripheral surfaces 13, 18 of the front plate 2 and of the sealing element 5 are still considered to be flush in spite of the bulge. The important thing here is that there is no gap between front plate 2 and mounting plate 4 at the outer peripheral surface.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The invention claimed is:

1. A hygiene-compliant display and control device comprising:
   a front plate having an outer peripheral surface on an edge of the front plate and a peripheral groove provided on and open to the outer peripheral surface;
   a body, extending from the front plate;
   a mounting plate;
   a sealing element arranged in the peripheral groove and being positionable between the edge of the front plate and the mounting plate, wherein, in a particular state, an outer peripheral surface of the sealing element is arranged flush with the outer peripheral surface of the front plate;

a plurality of clamping units being distributed around a periphery of the body and being structured and arranged to face the edge of the front plate and to create, with the edge of the front plate, a clamping connection, each of the clamping units comprising a pressing element;

a fixing frame contacts and rests against the mounting plate and engages with axial ends of the pressing elements; and the mounting plate contacts the fixing frame and the sealing element of the front plate.

2. The hygiene-compliant display and control device according to claim 1, wherein the sealing element comprises a first sealing body structured and arranged to form the outer peripheral surface of the sealing element.

3. The hygiene-compliant display and control device according to claim 2, the sealing element further comprising a further sealing body structured and arranged, relative to the peripheral edge of the sealing element, inside the first sealing body.

4. The hygiene-compliant display and control device according to claim 3, wherein at least one of the first sealing body and the further sealing body having a height greater than a depth of the peripheral groove.

5. The hygiene-compliant display and control device according to claim 1, at least one depression arranged in a base of the peripheral groove, and the sealing element having at least one projection structured and arranged to engage the at least one depression.

6. The hygiene-compliant display and control device according to claim 1, wherein the sealing element comprises at least one sealing body structured and arranged to form the outer peripheral surface of the sealing element.

7. The hygiene-compliant display and control device according to claim 6, wherein the at least one sealing body comprises a sealing surface structured and arranged toward the mounting plate.

8. The hygiene-compliant display and control device according to claim 6, wherein the at least one sealing body comprises at least a first sealing body and a second sealing body, the first sealing body forming the outer peripheral surface of the sealing element and the second sealing body being structured and arranged, relative to the peripheral edge of the sealing element, inside the first sealing body.

9. The hygiene-compliant display and control device according to claim 8, wherein the at least a first sealing body and a second sealing body each comprise a sealing surface structured and arranged extend toward the mounting plate.

10. The hygiene-compliant display and control device according to claim 9, wherein the peripheral groove has a base structured and arranged at a depth to face the mounting plate, and at least one of the first sealing body and the second sealing body have a height greater than the depth of base of the peripheral groove.

11. The hygiene-compliant display and control device according to claim 10, further comprising at least one depression arranged in the base of the peripheral groove, and the sealing element further comprising at least one projection structured and arranged to engage the at least one depression.

12. The hygiene-compliant display and control device according to claim 6, wherein the at least one sealing body comprises a sealing surface structured and arranged to extend toward the mounting plate.

13. The hygiene-compliant display and control device according to claim 12, wherein the peripheral groove has a base structured and arranged at a depth to face the mounting plate, and the at least one sealing body has a height greater than the depth of base of the peripheral groove.

14. The hygiene-compliant display and control device according to claim 13, further comprising at least one depression arranged in the base of the peripheral groove, and the sealing element further comprising at least one projection structured and arranged to engage the at least one depression.

15. The hygiene-compliant display and control device according to claim 1, further comprising a film provided on a surface of the front plate structured and arranged to face away from the mounting plate.

* * * * *